United States Patent
Zeng et al.

(10) Patent No.: US 10,319,428 B2
(45) Date of Patent: Jun. 11, 2019

(54) CONTROL METHOD OF SOLID STATE STORAGE DEVICE

(71) Applicant: LITE-ON TECHNOLOGY CORPORATION, Taipei (TW)

(72) Inventors: Shih-Jia Zeng, Taipei (TW); Jen-Chien Fu, Taipei (TW); Tsu-Han Lu, Taipei (TW); Kuan-Chun Chen, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/798,995

(22) Filed: Oct. 31, 2017

(65) Prior Publication Data

US 2019/0051346 A1 Feb. 14, 2019

(30) Foreign Application Priority Data

Aug. 9, 2017 (CN) .......................... 2017 1 0676223

(51) Int. Cl.
G11C 11/406 (2006.01)
G11C 16/14 (2006.01)
G11C 11/4091 (2006.01)

(52) U.S. Cl.
CPC .... G11C 11/40615 (2013.01); G11C 11/4091 (2013.01); G11C 16/14 (2013.01)

(58) Field of Classification Search
CPC .. G11C 11/40615; G11C 11/4091; G11C 6/14
USPC ....................................................... 365/174
See application file for complete search history.

(56) References Cited

U.S. PATENT DOCUMENTS

| | | | | |
|---|---|---|---|---|
| 9,135,166 B1* | 9/2015 | Syu | ................. | G11C 16/3431 |
| 9,478,303 B1* | 10/2016 | Parker | ................. | G11C 16/3418 |
| 2008/0198651 A1* | 8/2008 | Kim | ................. | G06F 12/0246 365/185.03 |
| 2011/0219203 A1* | 9/2011 | Nurminen | ................. | G11C 7/04 711/165 |
| 2014/0059405 A1* | 2/2014 | Syu | ................. | G11C 16/349 714/773 |
| 2014/0379978 A1* | 12/2014 | Kim | ................. | G11C 11/40622 711/106 |
| 2015/0058550 A1* | 2/2015 | Mikami | ................. | G11C 16/3431 711/106 |
| 2015/0106557 A1* | 4/2015 | Yu | ................. | G11C 16/3431 711/103 |
| 2015/0213851 A1* | 7/2015 | Mangione-Smith | ................. | G11C 14/0009 711/106 |
| 2015/0254006 A1* | 9/2015 | Jeong | ................. | G06F 3/0616 711/103 |
| 2016/0110249 A1* | 4/2016 | Orme | ................. | G06F 12/0238 714/6.24 |
| 2016/0141044 A1* | 5/2016 | Sun | ................. | G11C 16/10 365/185.11 |
| 2016/0163393 A1* | 6/2016 | Liang | ................. | G11C 16/349 365/185.12 |

(Continued)

*Primary Examiner* — Sung Il Cho
(74) *Attorney, Agent, or Firm* — WPAT, PC

(57) ABSTRACT

A control method of a solid state storage device includes the following steps. Firstly, a block of a memory cell array is checked. Then, a judging step is performed to judge whether a data storage time period of the block exceeds a threshold period. If the data storage time period of the block exceeds the threshold period, the block is tagged or a data of the block is refreshed.

8 Claims, 6 Drawing Sheets

(56) References Cited

U.S. PATENT DOCUMENTS

| | | | |
|---|---|---|---|
| 2016/0170871 A1* | 6/2016 | Hyun | G06F 3/0679 |
| | | | 711/103 |
| 2016/0180959 A1* | 6/2016 | Darragh | G06F 3/0653 |
| | | | 365/185.09 |
| 2017/0069395 A1* | 3/2017 | Yao | G11C 16/3418 |
| 2017/0131924 A1* | 5/2017 | Main | G11C 16/06 |
| 2017/0278858 A1* | 9/2017 | Walker | H01L 27/11578 |

* cited by examiner

| | Program erase count (P/E count) | | | | |
|---|---|---|---|---|---|
| | 0 | 2000 | 4000 | 6000 | 8000 |
| Periodic refresh(Prr) | 0.1% | 1% | 2% | 6% | 10% |
| Periodic refresh and prediction model (Prr) | 0.1% | 0.1% | 0.8% | 1% | 2% |

FIG. 9

CONTROL METHOD OF SOLID STATE STORAGE DEVICE

This application claims the benefit of People's Republic of China Patent Application No. 201710676223.3, filed Aug. 9, 2017, the subject matter of which is incorporated herein by reference.

FIELD OF THE INVENTION

The present invention relates to a control method of a solid state storage device, and more particularly to a control method of a solid state storage device for reducing the possibility of read retry.

BACKGROUND OF THE INVENTION

As is well known, solid state storage devices such as SD cards or solid state drives (SSD) are widely used in various electronic devices. Generally, a solid state storage device comprises a controlling circuit and a non-volatile memory. Moreover, the solid state storage device is also referred as a flash memory.

FIG. 1 is a schematic functional block diagram illustrating a conventional solid state storage device. As shown in FIG. 1, the solid state storage device 10 comprises an interface controller 101 and a non-volatile memory 105. The non-volatile memory 105 further comprises a memory cell array 109 and an array control circuit 111. The memory cell array 109 comprises plural memory cells. Generally, the memory cell array 109 is divided into plural blocks, and each block is divided into plural pages.

The solid state storage device 10 is connected with a host 14 through an external bus 12. Generally, the external bus 12 is a USB bus, an SATA bus, a PCIe bus, or the like. Moreover, the interface controller 101 is connected with the non-volatile memory 105 through an internal bus 113. According to a write command from the host 14, the interface controller 101 controls the array control circuit 111 to store the write data from the host 14 to the non-volatile memory 105. Alternatively, according to a read command from the host 14, the interface controller 101 controls the array control circuit 111 to acquire a read data from the non-volatile memory 105. In addition, the read data is transmitted to the host 14 through the interface controller 101.

Generally, the interface controller 101 stores a default read voltage set. During a read cycle, the interface controller 101 transmits an operation command to the array control circuit 111 of the non-volatile memory 105 through the internal bus 113. The interface controller 101 judges the previously-stored read data in the memory cell array 109 of the non-volatile memory 105 according to the default read voltage set.

The interface controller 101 further comprises an error correction (ECC) unit 104 for correcting the error bits of the read data. After the error bits of the read data are corrected, accurate read data are transmitted to the host 14. However, if the ECC unit 104 is unable to successfully correct all the error bits of the read data, the interface controller 101 cannot output the accurate read data to the host 14. Under this circumstance, the interface controller 101 provides retry read voltage sets. According to the retry read voltage sets, the interface controller 101 performs a read retry operation on the non-volatile memory 105.

Depending on the data amount to be stored in the memory cell, the memory cells may be classified into three types, i.e. a single-level cell (SLC), a multi-level cell (MLC) and a triple-level cell (TLC). The SLC can store only one bit of data per cell. The MLC can store two bits of data per cell. The TLC can store three bits of data per cell. In other words, the memory cell array 109 could be a SLC memory cell array, a MLC memory cell array or a TLC memory cell array.

In the memory cell array 109, each memory cell comprises a floating gate transistor. By adjusting the number of hot carriers injected into a floating gate of the floating gate transistor, the array control circuit 111 controls the storing state of the floating gate transistor. In other words, the floating gate transistor of each SLC has two storing states, the floating gate transistor of each MLC has four storing states, and the floating gate transistor of each TLC has eight storing states.

FIG. 2A schematically illustrates the threshold voltage distribution curves of triple-level cells in different storing states. According to the number of injected hot carriers, the triple-level cell has eight storing states "Erase" and "A"~"G". Before the hot carriers are injected into the memory cell, the memory cell is in a storing state "Erase". As the number of the injected hot carriers increases, the memory cell is sequentially in the other seven storing states "A"~"G". For example, the memory cell in the storing state "G" has the highest threshold voltage, and the memory cell in the storing state "Erase" has the lowest threshold voltage. After an erase cycle, the memory cell is restored to the storing state "Erase", and no or very few hot carriers are retained in the memory cell.

In practice, even if many memory cells are in the same storing state during the program cycle, the threshold voltages of these memory cells are not all identical. That is, the threshold voltages of these memory cells are distributed in a specified distribution curve with a median threshold voltage. The median threshold voltage of the memory cells in the storing state "Erase" is Ver. The median threshold voltage of the memory cells in the storing state "A" is Va. The median threshold voltage of the memory cells in the storing state "B" is Vb. The median threshold voltage of the memory cells in the storing state "C" is Vc. The median threshold voltage of the memory cells in the storing state "D" is Vd. The median threshold voltage of the memory cells in the storing state "E" is Ve. The median threshold voltage of the memory cells in the storing state "F" is Vf. The median threshold voltage of the memory cells in the storing state "G" is Vg. That is to say, the median threshold voltage for a greater number of memory cells in the storing state "A" is Va.

Please refer to FIG. 2A again. According to the above characteristics of the triple-level cell, a default read voltage set including seven read voltages Vra~Vrg is defined. During the read cycle, the interface controller 101 provides the default read voltage set to the array control circuit 111 in order to detect the storing states of the triple-level cells of the memory cell array 109.

The storing states of the triple-level cells are determined according to the read voltages Vra~Vrg. For example, the read voltage Vrg is provided from the array control circuit 111 to the memory cell array 109. If the threshold voltage of the memory cell is higher than the read voltage Vrg and the memory cell is turned off, the array control circuit 111 judges that the memory cell is in the storing state "G". Whereas, if the threshold voltage of the memory cell is lower than the read voltage Vrg and the memory cell is turned on, the array control circuit 111 judges that the memory cell is not in the storing state "G". In other words, the eight storing states of the triple-level cells are determined according to the seven read voltages Vra~Vrg of the default read voltage set.

Similarly, four storing states of the multi-level cells are determined according to three read voltages of the default read voltage set. Similarly, two storing states of the single-level cells are determined according to one read voltage of the default read voltage set.

FIG. 2B schematically illustrates the shift of the threshold voltage distribution curves of triple-level cells in different storing states. In some situations such as memory cells go through high erase/program cycling condition, a high/room temperature baking condition or a read disturbing condition, the threshold voltage distribution curves of the memory cells of the memory cell array 109 are possibly shifted. Moreover, if the hot carriers of the triple-level cells are kept in the floating gates in a relatively long time (e.g., over one month), the threshold voltage distribution curves are possibly shifted.

As shown in FIG. 2B, the threshold voltage distribution curves of the triple-level cells are shifted. The median threshold voltage of the memory cells in the storing state "Erase" is Ver'. The median threshold voltage of the memory cells in the storing state "A" is Va'. The median threshold voltage of the memory cells in the storing state "B" is Vb'. The median threshold voltage of the memory cells in the storing state "C" is Vc'. The median threshold voltage of the memory cells in the storing state "D" is Vd'. The median threshold voltage of the memory cells in the storing state "E" is Ve'. The median threshold voltage of the memory cells in the storing state "F" is Vf'. The median threshold voltage of the memory cells in the storing state "G" is Vg'.

If the storing states of the triple-level cells are determined according to the read voltages Vra~Vrg of the default read voltage set, the number of error bits in the read data increases. If the ECC unit 104 is unable to successfully correct all error bits of the read data, the interface controller 101 cannot output the accurate read data to the host 14. Under this circumstance, the interface controller 101 provides retry read voltage set including the read voltages Vra'~Vrg'. According to the retry read voltage set, the interface controller 101 performs the read retry operation.

FIG. 3 is a flowchart illustrating an error correction method for the conventional solid state storage device. During the read cycle, the interface controller 101 performs a decoding process A. In the decoding process A, a hard decoding operation is performed according to the default read voltage set. That is, the interface controller 101 provides the default read voltage set to the non-volatile memory 105, and the ECC circuit 104 performs the hard decoding operation to correct the read data.

If the error bits in the read data can be corrected, it means that the decoding process A passes and the decoding operation is successfully done. Consequently, the read data would be accurately transmitted from the interface controller 101 to the host 14. Whereas, if the error bits in the read data cannot be corrected, the read data is not accurately acquired and the decoding process A fails. Then, the interface controller 101 performs a read retry process.

After the interface controller 101 enters the read retry process, a decoding process B is performed. In the decoding process B, a hard decoding operation is performed according to a retry read voltage set. For example, the interface controller 101 provides the retry read voltage set Vra'~Vrg' to the non-volatile memory 105 to acquire the read data. Then, the ECC circuit 104 performs the hard decoding operation to correct the read data. If the error bits in the read data can be corrected, it means that the decoding operation is successfully done to pass the decoding process B. Consequently, the read data would be accurately transmitted from the interface controller 101 to the host 14. Whereas, if the error bits in the read data cannot be corrected, the accurate read data is not accurately acquired and the decoding process B fails.

Generally, plural retry read voltage sets are stored in the interface controller 101. That is, the process B would be executed multiple times, each time the interface controller 101 provides a different retry read voltage set. If the decoding operation is successfully done according to one of the plural retry read voltage sets, it means that the decoding process B passes. Whereas, if the data cannot be successfully decoded according to the entire of the plural retry read voltage sets, it means that the decoding process B fails. Then, the interface controller 101 performs a decoding process C. Obviously, the time period of performing the multiple decoding processes B is longer than the time period of performing the decoding process A.

In the decoding process C, a soft decoding operation is performed according to the retry read voltage set. Generally, the soft decoding operation has better error correction capability than the hard decoding operation. However, while the soft decoding operation is performed, the interface controller 101 acquires a read data according to many retry read voltage sets. In other words, the time period of performing the soft decoding operation is much longer. That is, the time period of performing the decoding process C is longer than the time period of performing the decoding process B.

Similarly, in the decoding process C, if the decoding operation is successfully done by the interface controller 101, it means that the decoding process C passes. Consequently, the read data could be accurately transmitted from the interface controller 101 to the host 14. Whereas, if the data cannot be successfully decoded by the interface controller 101, it means that the decoding process C fails. Under this circumstance, the interface controller 101 confirms that the read data cannot be accurately acquired and generates a failed message to the host 14 to indicate that the decoding process fails.

As mentioned above, if the decoding process A fails, the interface controller 101 enters the read retry process. In the read retry process, the interface controller 101 has to perform the decoding process B at first. If the interface controller 101 confirms that the decoding process B fails, the interface controller 101 performs the decoding process C. If the interface controller 101 confirms that the decoding process C fails, the interface controller 101 issues the failed message to the host 14.

FIG. 4 is a table illustrating the relationship between the program erase count and the probability of read retry for the conventional solid state storage device. After the memory cells of the memory cell array 109 have been programmed and erased many times, the performance is gradually deteriorated and the memory cell life is shortened. Consequently, during the read cycle, the possibility of read retry (Prr) is gradually increased.

Please refer to FIG. 4 again. When the solid state storage device 10 just leaves the factory, the program erase count (P/E count) of the block of the memory cell array 109 is very low and the performance of the memory cell is better. Under this circumstance, the possibility of read retry (Prr) for reading a block is about 0.1%.

As the program erase count of the memory cells of the memory cell array 109 gradually increases, the possibility of read retry (Prr) for reading a block gradually increases.

When the program erase count exceeds 2000, the possibility of read retry (Prr) for reading a block increases to 1%. When the program erase count exceeds 4000, the possibility of read retry (Prr) for reading a block increases to 10%. When the program erase count exceeds 6000, the possibility of read retry (Prr) for reading a block increases to 25%. When the program erase count exceeds 8000, the possibility of read retry (Prr) for reading a block increases to 60%.

As mentioned above, the program erase count is low and the performance of the memory cell is better when the solid state storage device 10 just leaves the factory. Under this circumstance, the reading speed of the solid state storage device 10 is not adversely affected. As the program erase count increases, the possibility of read retry (Prr) goes up. Under this circumstance, the reading speed of the solid state storage device 10 becomes slower and slower.

SUMMARY OF THE INVENTION

An embodiment of the present invention provides a control method of a solid state storage device. Firstly, a block of a memory cell array is checked. Then, a judging step is performed to judge whether a data storage time period of the block exceeds a threshold period. If the data storage time period of the block exceeds the threshold period, the block is tagged or a data of the block is refreshed.

Another embodiment of the present invention provides a control method of a solid state storage device. Firstly, a block of a memory cell array is checked. If a program erase count of the block exceeds a threshold count value, a block information and an environment information are acquired. Then, a possibility of read retry in the next few days is predicted according to the block information and the environment information. If the possibility of read retry in the next few days is higher than a threshold possibility value, the block is tagged or a data of the block is refreshed.

A further embodiment of the present invention provides a control method of a solid state storage device. Firstly, a block of a memory cell array is checked. Then, a judging step is performed to judge whether a data storage time period of the block exceeds a threshold period. If the data storage time period of the block exceeds the threshold period, the block is tagged or a data of the block is refreshed. If the data storage time period of the block does not exceed the threshold period and a program erase count of the block exceeds a threshold count value, a block information and an environment information are acquired. Then, a possibility of read retry in the next few days is predicted according to the block information and the environment information. If the possibility of read retry in the next few days is higher than a threshold possibility value, the block is tagged or a data of the block is refreshed.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 9 is a table illustrating the relationship between the program erase count and the probability of read retry for the solid state storage device of the present invention.

DETAILED DESCRIPTION OF PREFERRED EMBODIMENTS

As previously described, the decoding process B or the decoding process C requires a relatively long time period to accurately acquire the read data after the interface controller 101 enters the read retry process. For overcoming the drawbacks of the conventional technologies, the present invention provides a control method of a solid state storage device for reducing the possibility of read retry.

Figure 1:
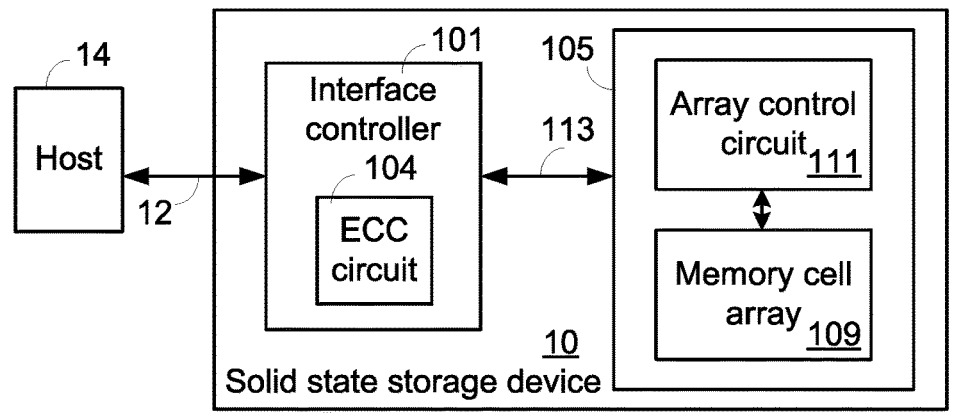
FIG. 1 (prior art) is a schematic functional block diagram illustrating a conventional solid state storage device.
Figure 2A:
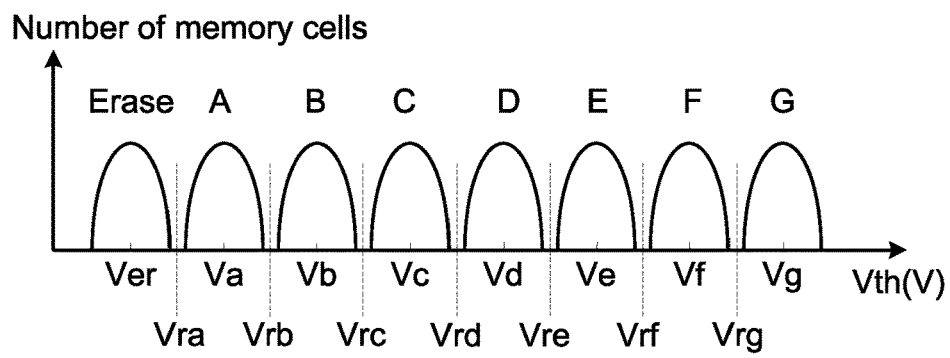
FIG. 2A (prior art) schematically illustrates the threshold voltage distribution curves of triple-level cells in different storing states.
Figure 2B:
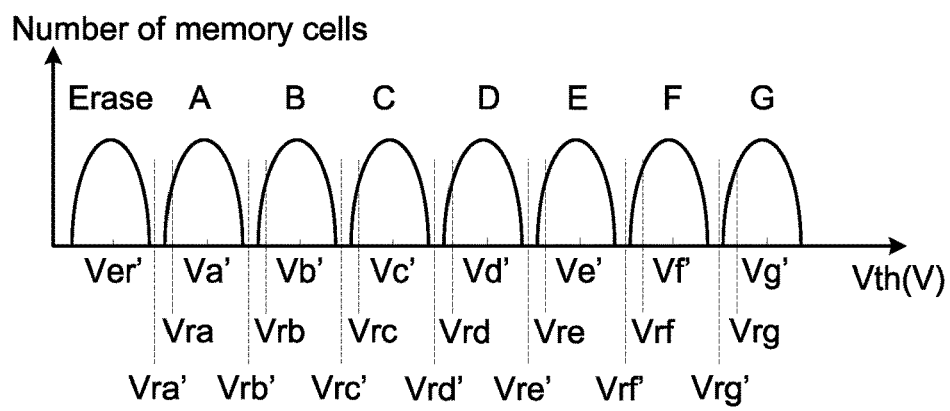
FIG. 2B (prior art) schematically illustrates the shift of the threshold voltage distribution curves of triple-level cells in different storing states.
Figures 3, 4:
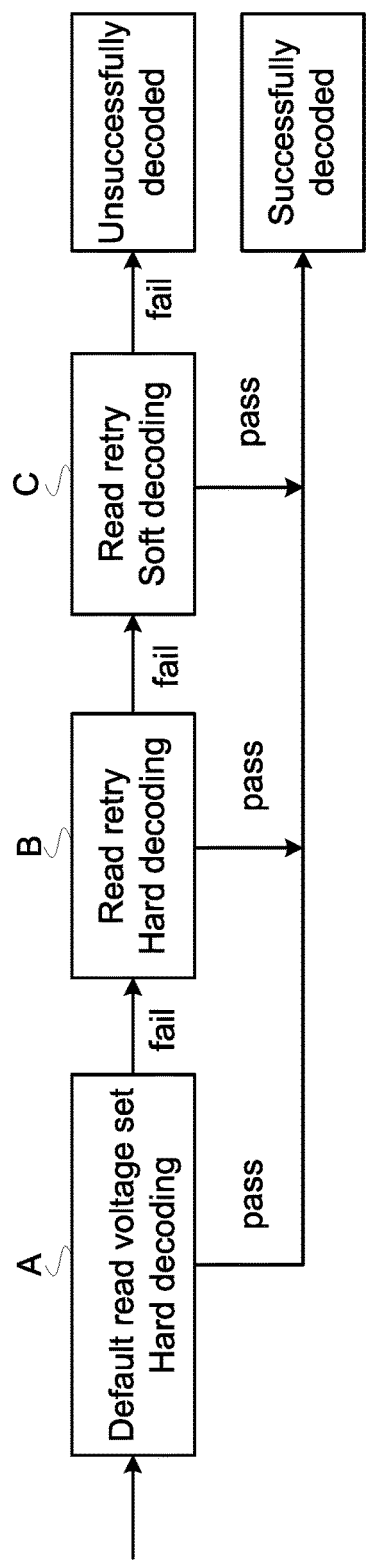
FIG. 3 (prior art) is a flowchart illustrating an error correction method for the conventional solid state storage device.
FIG. 4 (prior art) is a table illustrating the relationship between the program erase count and the probability of read retry for the conventional solid state storage device.

The architecture of the solid state storage device is similar to that of FIG. 1. That is, the solid state storage device 10 also comprises an interface controller 101 and a non-volatile memory 105. The non-volatile memory 105 comprises a memory cell array 109 and an array control circuit 111. The interface controller 101 comprises an ECC unit 104. The control method is executed by the interface controller 101. Consequently, the possibility of read retry is effectively reduced.

Generally, if the threshold voltage distribution curve corresponding to any storing state is seriously shifted and the interface controller 101 provides the default read voltage set to judge the read data of the non-volatile memory 105, many error bits are generated in the read data. Since the ECC unit 104 cannot successfully correct all error bits of the read data, the interface controller 101 needs to perform the read retry operation.

While the interface controller 101 performs the read retry operation, the reading speed of the solid state storage device 10 decreases obviously. If the interface controller 101 cannot acquire the accurate read data after the decoding process B and the decoding process C, the solid state storage device 10 is in a read failure condition and a data loss problem occurs.

Figure 5A:
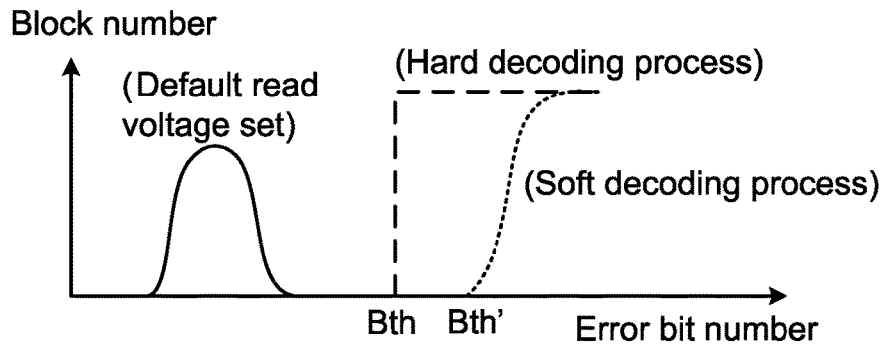
FIGS. 5A and 5B schematically illustrate the relationships between the block number and the error bit number of the solid state storage device.
Figure 5B:
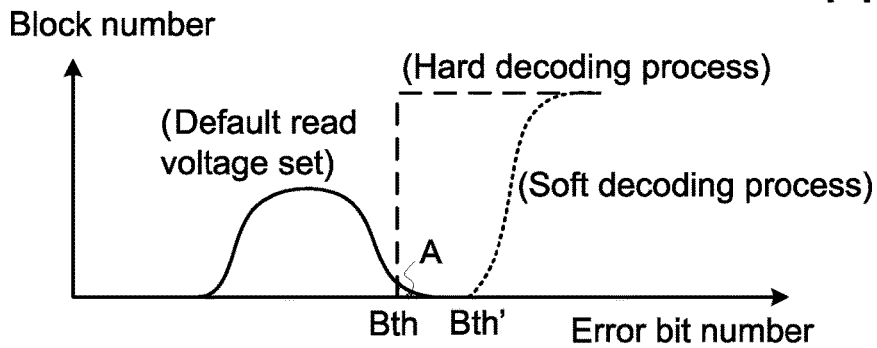

FIGS. 5A and 5B schematically illustrate the relationships between the block number and the error bit number of the solid state storage device. In the drawings, Bth denotes the hard decoding capability of the ECC unit 104, and Bth' denotes the soft decoding capability of the ECC unit 104. If the error bit number of a block is lower than Bth, the ECC unit 104 can successfully correct all bits of the read data and acquire the accurate read data through the hard decoding process. Similarly, if the error bit number of a block is lower than Bth', the ECC unit 104 can successfully correct all bits of the read data and acquire the accurate read data through the soft decoding process.

In the situation of FIG. 5A, the performance of the memory cell array 109 of the solid state storage device 10 is good and the error bit number of each block is lower than Bth. Meanwhile, the interface controller 101 acquires the read data according to the default read voltage set and acquire the accurate read data through the hard decoding process. Consequently, the possibility of read retry (Prr) for reading one block of the memory cell array 109 is zero.

In the situation of FIG. 5B, the performance of the memory cell array 109 of the solid state storage device 10 is gradually deteriorated. When the interface controller 101 acquires the read data according to the default read voltage set, the error bit number of the read data in some blocks (e.g., the portion A) is higher than Bth. Consequently, the interface controller 101 has to perform the read retry operation on the portion A.

Consequently, when the block number of the portion A is divided by the total block number of the memory cell array 109, the possibility of read retry (Prr) for reading one block of the memory cell array 109 is obtained. For example, the total block number of the memory cell array 109 is 1024, and block number of the portion A is 100. Consequently, the possibility of read retry (Prr) is 100/1024=9.8%.

Generally, according to a write command from the host 14, the associated write data are transmitted from the host 14 to the solid state storage device 10 and stored in the memory cell array 109. As the data storage time period increases, the shifted condition of the threshold voltage distribution curve becomes more serious. In the early stage of storing the write data in the memory cell array 109 (e.g., in the initial stage within one week), the possibility of read retry (Prr) for reading the write data by the interface controller 101 is low. As the data storage time period increases (e.g., the time period of hot carriers stayed in floating gates is over one month), the possibility of read retry (Prr) for reading the write data by the interface controller 101 increases obviously.

According to the above characteristics of the memory cell array 109, the present invention provides a control method of a solid state storage device.

Figure 6:
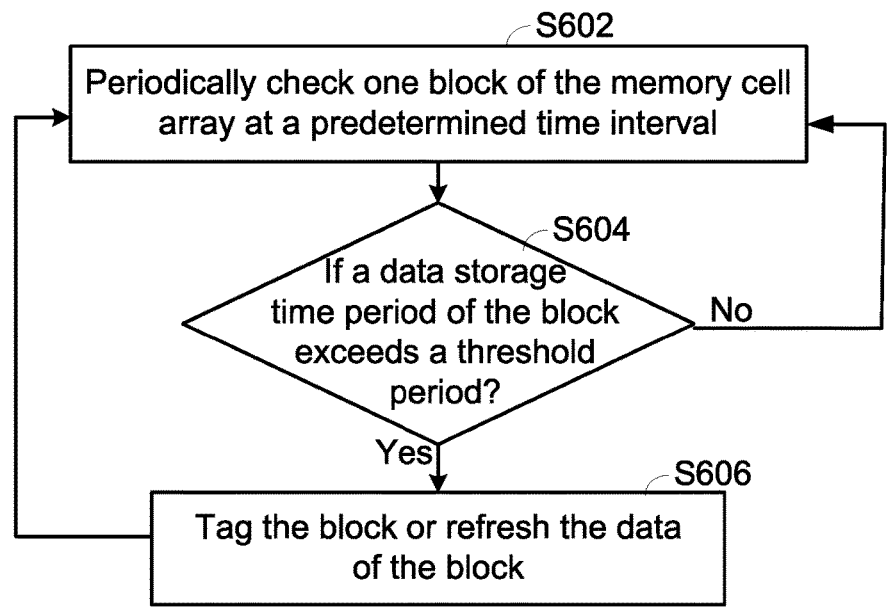
FIG. 6 is a flowchart illustrating a control method of a solid state storage device according to a first embodiment of the present invention.

FIG. 6 is a flowchart illustrating a control method of a solid state storage device according to a first embodiment of the present invention. When the solid state storage device 10 is in a normal working state, the interface controller 101 periodically checks one block of the memory cell array 109 at a predetermined time interval (Step S602). For example, the predetermined time interval is 20 minutes. It is noted that numerous modifications and alterations may be made while retaining the teachings of the invention. For example, in another embodiment, the predetermined time interval is not fixed. Alternatively, the interface controller 101 checks one block of the memory cell array 109 when the solid state storage device 10 is in an idle state without executing any command. Consequently, the loading of the solid state storage device 10 is reduced.

Then, the interface controller 101 judges whether a data storage time period of the block exceeds a threshold period (Step S604). Generally, the threshold period is determined according to the characteristics of the memory cell array 109. For example, if the characteristics of the memory cell array 109 are in good conditions, the value of the threshold period would be set to a higher value (e.g., 14 days or two weeks). Whereas, if the characteristics of the memory cell array 109 are deteriorated, the threshold period should be set to a smaller value (e.g., 7 days or one week).

If the data storage time period of the block does not exceed the threshold period (Step S604), the step S602 is repeatedly done. Since the data storage time period of the block does not exceed the threshold period, the possibility of read retry (Prr) for reading the block by the interface controller 101 in the next few days is low. In this context, the term "the next few days" is a within fixed number of days (e.g., three days) in the future and the possibility of read retry (Prr) for reading the block by the interface controller 101 is low.

If the data storage time period of the block exceeds the threshold period (Step S604), the block is tagged or the data of the block is refreshed (Step S606). Since the data storage time period of the block exceeds the threshold period, the possibility of read retry (Prr) for reading the block by the interface controller 101 in the next few days is high. Consequently, the block is tagged by the interface controller 101. When the data of the block is read in the future, the interface controller 101 acquires the read data according to the retry read voltage set. Consequently, the reading speed is not reduced.

While the data of the block is refreshed by the interface controller 101, the data of the block is moved to a blank block of the memory cell array 109.

In accordance with the feature of the present invention, the block with the longer data storage time period is periodically refreshed by the interface controller 101. After the refresh action is completed, the data in the old block has been moved to a new block of the memory cell array 109. After the data is written into the new block, the data storage time period is counted from zero. Under this circumstance, the possibility of read retry (Prr) for reading the new block by the interface controller 101 is largely reduced.

As mentioned above, the block with the longer data storage time period is periodically refreshed by the interface controller 101. It is noted that numerous modifications and alterations may be made while retaining the teachings of the invention. For example, in another embodiment, a prediction model for predicting the possibility of read retry (Prr) is built according to a machine learning algorithm. If the prediction model predicts that the possibility of read retry (Prr) for reading a specified block in the next few days (e.g., three days) is higher than a threshold possibility value, the specified block is tagged or the data of the block is refreshed. For example, the threshold possibility value is 10%.

Figure 7:
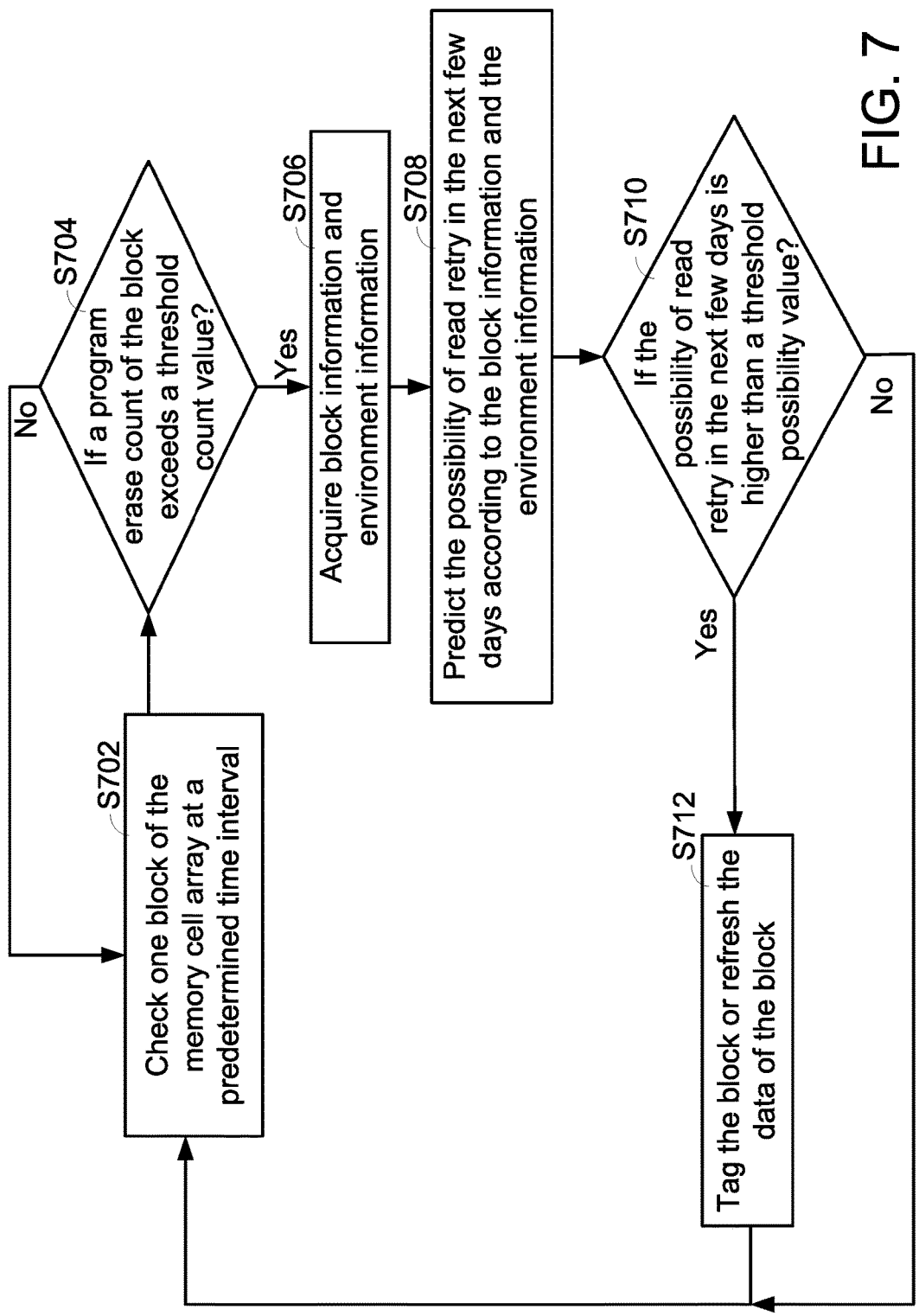
FIG. 7 is a flowchart illustrating a control method of a solid state storage device according to a second embodiment of the present invention.

FIG. 7 is a flowchart illustrating a control method of a solid state storage device according to a second embodiment of the present invention. When the solid state storage device 10 is in a normal working state, the interface controller 101 periodically checks one block of the memory cell array 109 at a predetermined time interval (Step S702). For example, the predetermined time interval is 20 minutes. It is noted that numerous modifications and alterations may be made while retaining the teachings of the invention. For example, in another embodiment, the predetermined time interval is not fixed. Alternatively, the interface controller 101 checks one block of the memory cell array 109 when the solid state storage device 10 is in an idle state without executing any command. Consequently, the loading of the solid state storage device 10 is reduced.

Then, the interface controller 101 judges whether a program erase count of the block exceeds a threshold count value (Step S704). If the program erase count of the block does not exceed the threshold count value (Step S704), the step S702 is repeatedly done. Since the program erase count of the block does not exceed the threshold count value, the possibility of read retry (Prr) for reading the block by the interface controller 101 in the next few days is low.

If the program erase count of the block exceeds the threshold count value (Step S704), the interface controller 101 acquires block information and environment information (Step S706). For example, the block information includes the information about the data storage time period, the program time (how long it takes to program the block), the erase time (how long it takes to erase the block), the error bit or the possibility of read retry. The environment information includes the information about the current operation temperature of the solid state storage device 10, the accumulated operation time period at the current operation temperature, the previous operation temperature of the solid state storage device 10 or the accumulated operation time period at the previous operation temperature.

Generally, the block information indicates the current characteristics of the memory cells of the block. For example, in case that the program time and the erase time of the block are shorter, the memory cells of the block have better characteristics. Whereas, in case that the program time and the erase time of the block are longer, the memory cells of the block have inferior characteristics. Similarly, the error bit number may be used to indicate the characteristics of the memory cells of the block. Moreover, the current possibility of read retry may be estimated according to the error bit number.

In some embodiments, the interface controller 101 reads a portion of the data in the block and estimates the error bit number of the whole block. Consequently, the loading of the interface controller 101 is reduced. For example, the interface controller 101 reads one page of the block, estimates the possibility of read retry (Prr) according to the error bit number of the page, and calculates the error bit number and the possibility of read retry (Prr) of the whole block.

Moreover, the degradation degree of the memory cells in the next few days may be predicted according to the environment information. For example, if the current operation temperature of the solid state storage device 10 is high, the memory cells degrade more quickly. That is, the degradation degree of the memory cells in the next few days may be predicted according to the current operation temperature of the solid state storage device 10, the accumulated operation time period at the current operation temperature, the previous operation temperature of the solid state storage device 10 or the accumulated operation time period at the previous operation temperature.

Then, the interface controller 101 predicts the possibility of read retry (Prr) in the next few days according to the block information and the environment information (Step S708). After the block information and the environment information are inputted into the prediction model, the prediction model predicts the possibility of read retry (Prr) in the next few days.

Then, the interface controller 101 judges whether the possibility of read retry (Prr) in the next few days is higher than a threshold possibility value (Step S710). If the possibility of read retry (Prr) in the next few days is not higher than the threshold possibility value, the step S702 is repeatedly done. Whereas, if the possibility of read retry (Prr) in the next few days is higher than the threshold possibility value, the block is tagged or the data of the block is refreshed (Step S712).

Since the possibility of read retry (Prr) in the next few days is higher than the threshold possibility value, the possibility of read retry (Prr) for reading the block by the interface controller 101 in the next few days is high. Consequently, the block is tagged by the interface controller 101. When the data of the block is read in the future the interface controller 101 acquires the read data according to the retry read voltage set. Consequently, the reading speed is not reduced.

While the data of the block is refreshed by the interface controller 101, the data of the block is moved to a blank block of the memory cell array 109. After the refresh action is completed, the data in the old block has been moved to a new block of the memory cell array 109. After the data is written into the new block, the data storage time period is counted from zero. Under this circumstance, the possibility of read retry (Prr) for reading the new block by the interface controller 101 is largely reduced.

Figure 8:
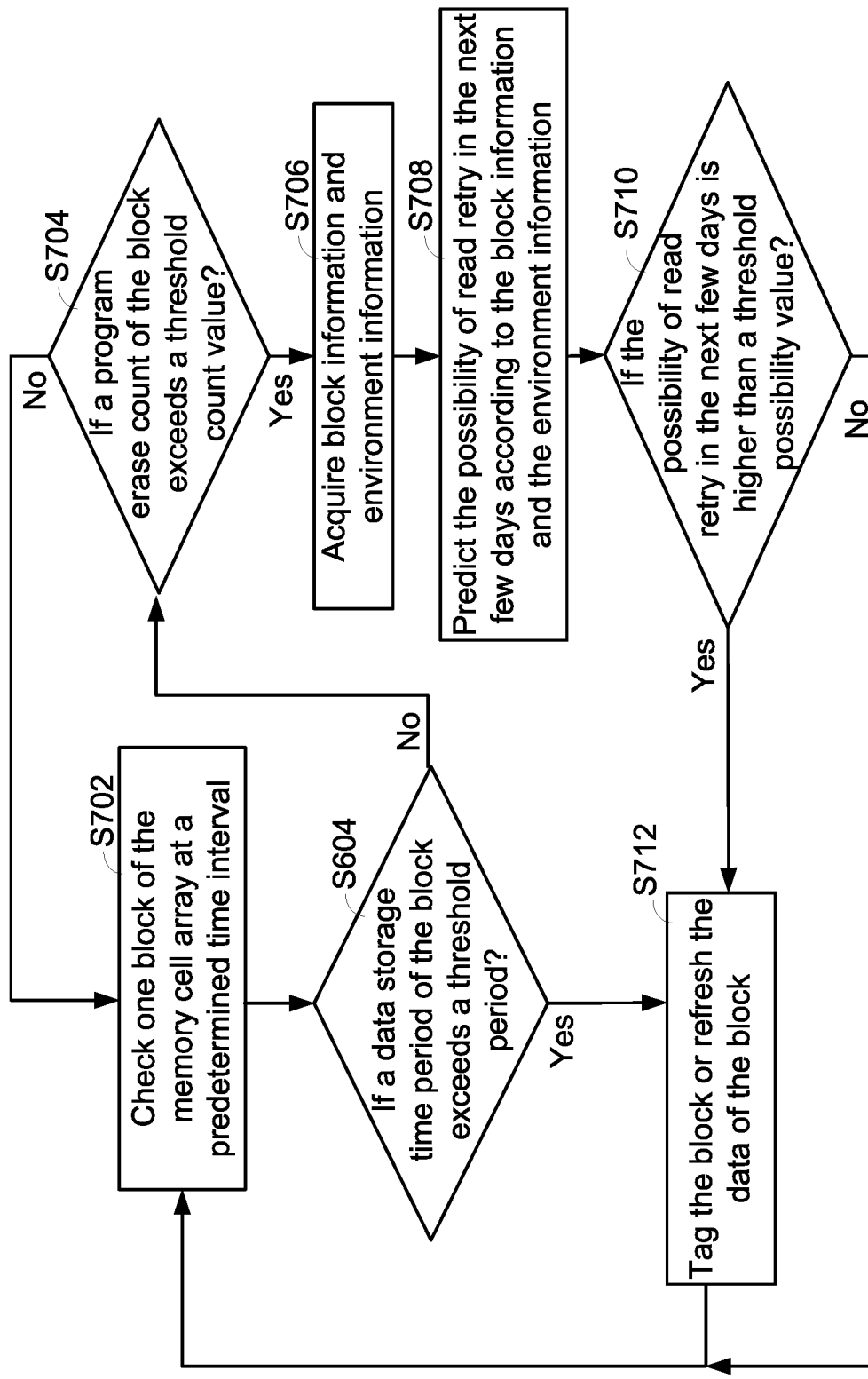
FIG. 8 is a flowchart illustrating a control method of a solid state storage device according to a third embodiment of the present invention.

FIG. 8 is a flowchart illustrating a control method of a solid state storage device according to a third embodiment of the present invention. The control method of this embodiment is the combination of the second embodiment and the first embodiment. In comparison with the second embodiment, the control method of this embodiment further comprises a step S604 between the step S702 and the step S712. For succinctness, only the step S604 will be described as follows.

In the step S604, the interface controller 101 judges whether a data storage time period of the block exceeds a threshold period. If the data storage time period of the block does not exceed the threshold period, the step S704 is performed. Whereas, if the data storage time period of the block exceeds the threshold period, block is tagged or the data of the block is refreshed (Step S712).

FIG. 9 is a table illustrating the relationship between the program erase count and the probability of read retry for the solid state storage device of the present invention.

In an embodiment, the control method of the first embodiment is applied to the solid state storage device 10. When the program erase count is lower than 2000, the possibility of read retry (Prr) for reading a block is about 0.1%. When the program erase count exceeds 2000, the possibility of read retry (Prr) for reading a block increases to 1%. When the program erase count exceeds 4000, the possibility of read retry (Prr) for reading a block increases to 2%. When the program erase count exceeds 6000, the possibility of read retry (Prr) for reading a block increases to 6%. When the program erase count exceeds 8000, the possibility of read retry (Prr) for reading a block increases to 10%.

In another embodiment, the control method of the third embodiment is applied to the solid state storage device 10. When the program erase count is lower than 2000, the possibility of read retry (Prr) for reading a block is about 0.1%. When the program erase count exceeds 2000, the possibility of read retry (Prr) for reading a block still is 0.1%. When the program erase count exceeds 4000, the possibility of read retry (Prr) for reading a block increases to 0.8%. When the program erase count exceeds 6000, the possibility of read retry (Prr) for reading a block increases to 1%. When the program erase count exceeds 8000, the possibility of read retry (Prr) for reading a block increases to 2%.

Obviously, when the control method of the first embodiment or the third embodiment is applied to the solid state storage device 10, the possibility of read retry (Prr) for reading the block by the interface controller 101 is largely reduced. Consequently, the reading speed of the solid state storage device 10 is not obviously reduced.

Moreover, a prediction model for predicting the possibility of read retry (Prr) is built according to a machine learning algorithm. The prediction model is used for predicting the possibility of read retry (Prr) for reading a specified block in the next few days. For example, the prediction model is a prediction function or a look-up table.

For various conditions of the memory cell array 109, the manufacturer of the solid state storage device 10 collects the block information and the environment information of each block in the memory cell array 109 and obtains the relationships between the block information, the environment information and the possibility of read retry (Prr) before the solid state storage device 10 leaves the factory. Moreover, the relationships are stored in a database.

For example, the block information includes the information about the data storage time period, the program time, the erase time, the error bit or the current possibility of read retry. The environment information includes the information about the current operation temperature of the solid state storage device 10, the accumulated operation time period at the current operation temperature, the previous operation temperature of the solid state storage device 10 or the accumulated operation time period at the previous operation temperature. It is noted that the contents of the block information and the environment information are not restricted. For example, the block information may further contain the program count, the erase count and the read count.

In an embodiment, the prediction model is built according to the machine learning algorithm on the contents of the database. The prediction model is a prediction function that is a function of the block information and the environment information. For example, the prediction function is acquired according to a linear regression method, and the prediction function is a function of the program time (Pt), the erase time (Et), the error bit number (Eb) and the operation temperature (T). That is, Prr(Pt, Et, Eb, T)=c1×Pt+c2×Et+dc×Eb+c4×T, wherein c1, c2, c3 and c4 are coefficients. The above prediction model (i.e., the prediction function) is stored in the interface controller 101 before the solid state storage device 10 leaves the factory.

When the solid state storage device 10 is in the normal working state, the interface controller 101 inputs the program time (Pt), the erase time (Et), the error bit number (Eb) and the operation temperature (T) into the prediction function. Consequently, the possibility of read retry (Prr) for reading the block in the next few days is calculated.

In some embodiment, the prediction model is a look-up table. After the interface controller 101 inputs the program time (Pt), the erase time (Et), the error bit number (Eb) and the operation temperature (T) into the look-up table, the possibility of read retry (Prr) for reading the block in the next few days is calculated.

It is noted that the way of acquiring the prediction model is not restricted to the linear regression method. In some other embodiments, the prediction model is acquired according to a Lasso regression method or a Ridge regression method.

From the above descriptions, the present invention provides a control method of a solid state storage device. When the solid state storage device is in a normal working state, the interface controller periodically checks one block of the memory cell array at a predetermined time interval and estimates the possibility of read retry (Prr) for reading the block in the next few days. If the estimated possibility of read retry (Prr) is high, the block is tagged or the data of the block is refreshed. Consequently, the reading speed of the solid state storage device is not obviously reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control method for refreshing a solid state storage device, the control method comprising steps of:
   checking a block of a memory cell array;
   judging whether a data storage time period of the block exceeds a threshold period, wherein said data storage time is an age of data storage on the block before refreshing;
   if the data storage time period of the block exceeds the threshold period, then tagging the block or refreshing a data of the block;
   if the data storage time period of the block does not exceed the threshold period and a program erase count of the block exceeds a threshold count value, then acquiring a block information and an environment information, and predicting a possibility of read retry in the next few days according to the block information and the environment information; and
   if the possibility of read retry in the next few days is higher than a threshold possibility value, then tagging the block or refreshing the data of the block.

2. The control method as claimed in claim 1, wherein an interface controller of the solid state storage device periodically checks the block of the memory cell array at a predetermined time interval.

3. The control method as claimed in claim 1, wherein the tagged block is read, an interface controller of the solid state storage device acquires a read data according to a read retry voltage set.

4. The control method as claimed in claim 1, wherein while the data of the block is refreshed, the data stored in the block is moved to a blank block of the memory cell array.

5. The control method as claimed in claim 1, wherein after the block information and the environment information are inputted into a prediction model, the possibility of read retry in the next few days is outputted from the prediction model.

6. The control method as claimed in claim 5, wherein the prediction model is a prediction function or a look-up table.

7. The control method as claimed in claim 5, wherein the block information includes a data storage time period, a program time, an erase time, an error bit, a current possibility of read retry, a program count, an erase count or a read count.

8. The control method as claimed in claim 5, wherein the environment information includes a current operation temperature or a previous operation temperature.

* * * * *